United States Patent
Hummerston et al.

(10) Patent No.: US 8,040,264 B2
(45) Date of Patent: Oct. 18, 2011

(54) PIPELINE ANALOG TO DIGITAL CONVERTER AND A RESIDUE AMPLIFIER FOR A PIPELINE ANALOG TO DIGITAL CONVERTER

(75) Inventors: Derek Hummerston, Hungerford (GB); Christopher Peter Hurrell, Cookham (GB); Colin Lyden, Baltimore (IE)

(73) Assignee: Analog Devices, Inc., Norwood, MA (US)

( * ) Notice: Subject to any disclaimer, the term of this patent is extended or adjusted under 35 U.S.C. 154(b) by 34 days.

(21) Appl. No.: 12/717,448

(22) Filed: Mar. 4, 2010

(65) Prior Publication Data

US 2011/0215957 A1   Sep. 8, 2011

(51) Int. Cl.
 *H03M 1/06* (2006.01)
(52) U.S. Cl. .......................... 341/118; 327/94; 348/241
(58) Field of Classification Search .......... 341/118–155; 327/91, 94, 307; 348/241, 243, 308, 533
See application file for complete search history.

(56) References Cited

U.S. PATENT DOCUMENTS

| | | | | |
|---|---|---|---|---|
| 6,529,237 B1 * | 3/2003 | Tsay et al. | ..................... | 348/241 |
| 7,551,115 B2 * | 6/2009 | Bailey et al. | ................... | 341/161 |
| 7,786,920 B2 * | 8/2010 | Gerber et al. | .................. | 341/161 |
| 7,843,233 B2 * | 11/2010 | Lee | ................................ | 327/94 |
| 7,936,297 B2 * | 5/2011 | Hurrell et al. | .................. | 341/155 |

* cited by examiner

*Primary Examiner* — Lam T Mai
(74) *Attorney, Agent, or Firm* — Kenyon & Kenyon LLP (57) ABSTRACT

A pipeline analog to digital converter comprising: a first analog to digital converter for determining a first part of an analog to digital conversion result, and for forming a residue signal; an amplifier for amplifying the residue signal, the amplifier including at least one offset sampling capacitor for sampling an offset of the amplifier, wherein at least one resistance is associated with the at least one capacitor so as to form a filter, and the at least one resistor is variable such that an amplifier bandwidth can be switched between a first bandwidth and a second bandwidth less than the first bandwidth during sampling of the offset.

21 Claims, 11 Drawing Sheets

PIPELINE ANALOG TO DIGITAL CONVERTER AND A RESIDUE AMPLIFIER FOR A PIPELINE ANALOG TO DIGITAL CONVERTER

The present invention relates to a pipeline analog to digital converter and to an improved residue amplifier for use in such a converter.

BACKGROUND OF THE INVENTION

Figure 1:
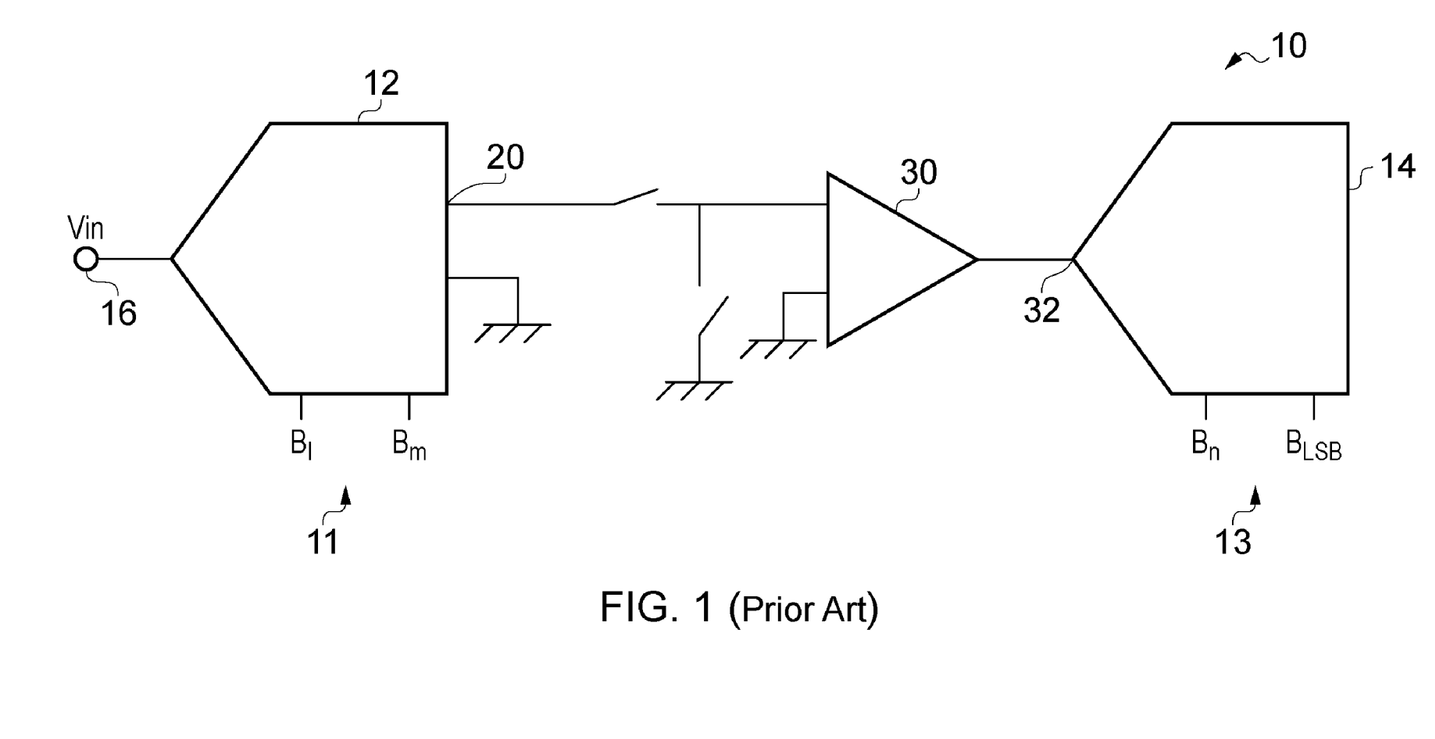
FIG. 1 schematically shows a prior art pipeline analog to digital converter.

Various analog to digital converter topologies are known. One converter topology is that of a pipeline converter. In such an arrangement the analog to digital converter is divided into a plurality of stages, each including an analog to digital converter, and each is responsible for processing an individual part of the result. Such an arrangement is shown in FIG. 1 where a pipeline analog to digital converter, generally designated 10, comprises a first stage 11 which includes a first analog to digital converter 12 and a second stage 13 which includes a second analog to digital converter 14. The first analog to digital converter 12 receives an input signal $V_{in}$ at an input node 16 and creates a digital approximation of this input signal of which it derives the first M bits $B_1$ to $B_M$ of a conversion result. There will, naturally, be an error between the actual input value $V_{in}$ and the corresponding digitised value $B_1$ to $B_M$ as derived by a digital to analog converter provided within the analog to digital converter 12. This error between the analog input signal $V_{in}$ and the corresponding analog representation of the digital result $V_{DAC1}$ is output as a residue at a residue output 20 of the first analog to digital converter 12. In order to facilitate the operation of the second analog to digital converter 14 which converts the lower order bits $B_N$ to $B_{LSB}$ where LSB represents the least significant bit, the residue is acted on by an amplifier 30 interposed between the residue output of the first analog to digital converter 12 and a signal input 32 of the second analog to digital converter 14.

The provision of the amplifier 30, which is generally known as a residue amplifier, means that the magnitude of the input signal to the second analog to digital converter 14 is much increased, thereby simplifying the design of the second analog to digital converter and improving its performance in terms of signal to noise ratio.

The pipeline converter topology also allows an increase in digital throughput. Thus, for example, whilst the second analog to digital converter 14 is converting the least significant bits $B_N$ to $B_{LSB}$ of a Dth word, the first analog to digital converter 12 can be converting the most significant bits $B_1$ to $B_M$ of a D+1th conversion. As such it remains an important topology.

SUMMARY OF THE INVENTION

According to a first aspect of the present invention there is provided a pipeline analog to digital converter comprising:
 a first analog to digital converter for determining a first part of an analog to digital conversion result, and for forming a residue signal;
 an amplifier for amplifying the residue signal, the amplifier including at least one offset sampling capacitor for sampling an offset of the amplifier,
 wherein at least one resistance is associated with the at least one capacitor so as to form a filter, and the at least one resistance is variable such that a filter bandwidth can be switched between a first bandwidth and a second bandwidth less than the first bandwidth.

It is thus possible to provide an offset sampling capacitor such that offsets within the residue amplifier can be measured and corrected for. The offset signal can be regarded as the signal occurring at an output node of the residue amplifier when the input or inputs thereof are held to a "zero" value or shorted together.

Conventionally the person skilled in the art thinks of the offset as a DC, i.e. non varying, signal. However the inventors realised that the offset value, when sampled, should be regarded as the super position of a DC offset signal and a plurality of noise components having a plurality of frequencies. This effects the way that one should treat noise in a sampled data system such as one constituted by the pipeline analog to digital converter.

Advantageously the residue amplifier of the pipeline analog to digital converter comprises first and second amplifier stages. Preferably the at least one offset sampling capacitor interconnects the first stage to the second stage. In such an arrangement the at least one offset sampling capacitor can be arranged to sample both the offset from the first stage and the offset from the second stage, and an offset voltage representing the sum of both of these offsets can be stored as a voltage difference across the offset sampling capacitor such that the amplifier looks as if it is substantially offset free.

Advantageously the first amplifier stage is a voltage amplifier and the second amplifier stage is a transconductance, $g_m$, amplifier stage.

Advantageously the second amplifier stage has a switchable unity gain feedback loop which can be switched on when it is desired to store and correct for offsets within the residue amplifier, such a process commonly being known as "auto-zeroing" the residue amplifier.

Advantageously a switch is provided intermediate the second stage amplifier and the at least one offset sampling capacitor such that the at least one offset sampling capacitor can be isolated from the second stage amplifier just before the second stage amplifier feedback loop is closed so as to avoid transients being pushed onto the sampling capacitor. Once the feedback loop has been closed and transient activity within the second stage amplifier has substantially ceased, the switch is then placed in a low impedance state such that the capacitor is connected to the input of the second stage amplifier.

In a preferred embodiment the unity gain feedback loop for the second amplifier comprises first and second switches in series between an amplifier output and a suitable input of the amplifier. The switches define an intermediate node to which a third switch is connected. The third switch is operable to connect the intermediate node to a reference voltage, such as ground or one of the supply rails. Alternatively the third switch can connect between the pair of intermediate nodes that exist in a differential arrangement. This switch configuration has the advantage of preventing "Miller effect" multiplication of any parasitic capacitance that would have occurred if a single switch had been used to make and break the unity gain feedback loop.

In a preferred embodiment of the invention the at least one resistance comprises at least one of an output impedance of the first stage of the residue amplifier, an input impedance of the second stage of the residue amplifier, and a resistor (or several resistors) interconnecting the first and second stages. Thus, any of these may be varied in order to change the bandwidth of the filter.

In a preferred embodiment a variable resistor and the capacitor are in series combination between an output of the first stage of the residue amplifier and an input of the second stage thereof. However, the resistor can also be placed in parallel with the input or output nodes of the second stage of the residue amplifier.

In fact, for the two stage residue amplifier a capacitor, or a combination of both a resistor and a capacitor can be used in place of the at least one resistor to control the bandwidth of the amplifier.

According to a second aspect of the present invention there is provided a method of operating a pipeline analog to digital converter comprising a first analog to digital conversion stage, a second analog to digital conversion stage, a residue amplifier for amplifying a residue from the first analog to digital conversion stage for use as an input to the second analog to digital conversion stage, and wherein the residue amplifier is further under the control of a controller to perform auto-zeroing and is switchable between a first amplifier bandwidth and a second amplifier bandwidth having a second amplifier bandwidth time constant, and wherein, in use, the residue amplifier is placed in an auto-zero mode for at least some of the time when it is not required to amplify the residue, and a predetermined period before amplification of the residue is required the bandwidth of the residue amplifier is reduced during its auto-zeroing operation, or the residue amplifier is operated in its reduced bandwidth mode during the entirety of the auto-zeroing operation.

BRIEF DESCRIPTION OF THE FIGURES

The present invention will further be described, by way of non-limiting example only, with reference to the accompanying Figures, in which.

DETAILED DESCRIPTION

Returning to FIG. 1, it can be seen that the residue amplifier 30 amplifies the residue signal from the output 20 of the first analog to digital converter 12 and provides this as an input to the second analog to digital converter 14. If the amplifier 30 was an ideal component then the residue voltage $V_{res}$ would be amplified by the gain A of the amplifier 30 and output such that the amplifier output voltage was $V_{out}=A \cdot V_{res}$. In the arrangement shown in FIG. 1 the first ADC 11 has been assumed to include a switched capacitor DAC which has been used to sample the input voltage $V_{in}$. Such a switched capacitor stage will, for the sake of completeness, be described later. However, as such a device operates it automatically forms, at each bit trial, a voltage representing a difference between the analog representation of the digital word being output and/or trialled by the DAC and the input voltage. Thus the residue is formed automatically once $B_1$ to $B_m$ have been determined. However, in alternative arrangements a differencing amplifier could be provided to receive $V_{in}$ and $V_{DAC1}$, where $V_{DAC1}$ is the output from the DAC within the first analog to digital converter 11, and to form the difference between them, i.e. $V_{res}$.

However the amplifier 30 is a real component and its DC or low frequency response will include an offset term $V_{off}$ which may vary with component temperature within the amplifier 30. As a result the amplifier output is $$V_{out}=V_{off}+A \cdot V_{res}$$

It is known in the prior art to short the inputs of the amplifier together, or otherwise to connect the input of amplifier 30 to ground, such that the amplifier output is only its offset voltage $V_{off}$, and then to sample this onto a storage capacitor such that this offset value can be subtracted from the amplifier output. This would hitherto have been assumed to take care of the offset problem. However, if one considers the offset as a signal at the input of the amplifier, and also allows for the fact that the offset will include noise then this approach to auto-zeroing does not always work as expected.

Figure 2A:
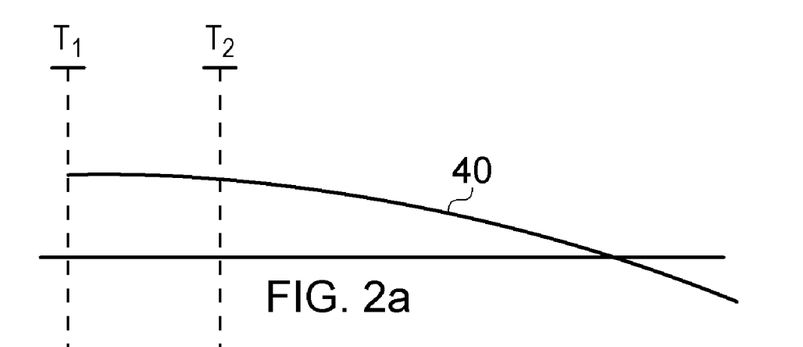
FIGS. 2a to 2c schematically illustrates how components of a noise voltage can change between an auto-zero process occurring at time $T_1$ and a residue signal being amplified at time $T_2$.
Figure 2B:
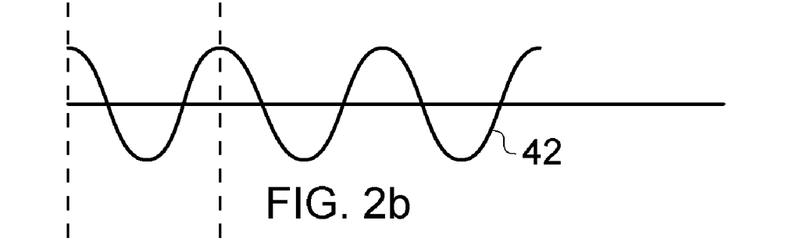
Figure 2C:
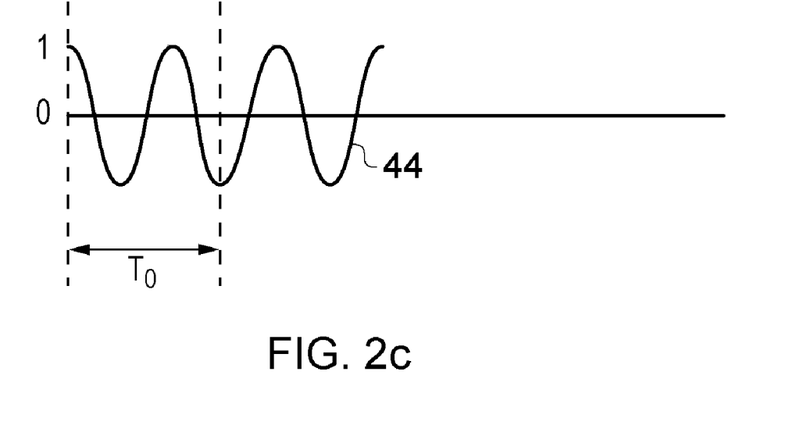

FIG. 2 illustrates a case where, at time $T_1$, the offset voltage of the amplifier is sampled and stored on an offset sampling capacitor. The time $T_2$ represents a measurement instant where, for example, the residue from the first analog to digital converter is being passed to the residue amplifier for amplification. For simplicity we will assume that the residue is zero volts. We could, just as generally, have considered the signal at the input of the residue amplifier to be the superposition of the output from the first analog to digital converter and the offset of the residue amplifier, as referenced to the input thereof, so $V_{out}=A(V_{res}+V_{input\ offset})$ and could equally validly have ignored the signal component from the analog to digital converter for the purposes of this discussion. However, considering the simplest case where the residue is zero volts, then one would expect a value $V(T_2)$ at $T_2$ to be identical to the value $V(T_1)$ at $T_1$ and hence the offset subtraction process performed as part of the amplifier function would form $V(T_2)-V(T_1)=0$ and we would assume that the offset had been removed.

If we now consider the presence of a noise having various component frequencies then the situation can change. Returning to FIG. 2, graph 2a shows a low frequency signal component which has a time period which is long compared to the time period $T_0$ between $T_1$ and $T_2$. It can therefore be seen that the signal 40 barely changes between $T_1$ and $T_2$, and consequently forming the difference $V(T_2)-V(T_1)$ substantially removes the contribution from this low frequency component.

FIG. 2b shows a higher frequency noise component 42 whose period just happens to coincide with the time difference between $T_2$ and $T_1$. Thus, a sample of the noise voltage from this signal occurring at time period $T_1$ substantially matches the noise voltage occurring from this signal occurring at time period $T_2$. Thus forming the difference $V(T_2)-V(T_1)$ results in substantial cancellation of this component.

FIG. 2c shows a higher frequency component 44 whose period is only ⅔ of the time period between $T_1$ and $T_2$. Thus, as shown at time period $T_1$ a sample of the signal occurs at the peak of the voltage amplitude whereas at time $T_2$ the sample occurs at the trough of the voltage amplitude. If the signal has an amplitude of one arbitrary unit then forming the difference $V(T_2)-V(T_1)$ results in an output result of two arbitrary units for the signal. Thus, rather than nulling out the effect of the offset this frequency component has its contribution doubled. Thus, if the offset is treated as a broadband noise source having a spectrum extending from DC (0 Hz) upwards then it can be seen that the simple offset sampling and subtraction approach can actually enhance the signal power of some frequency components of the offset signal.

Figure 3:
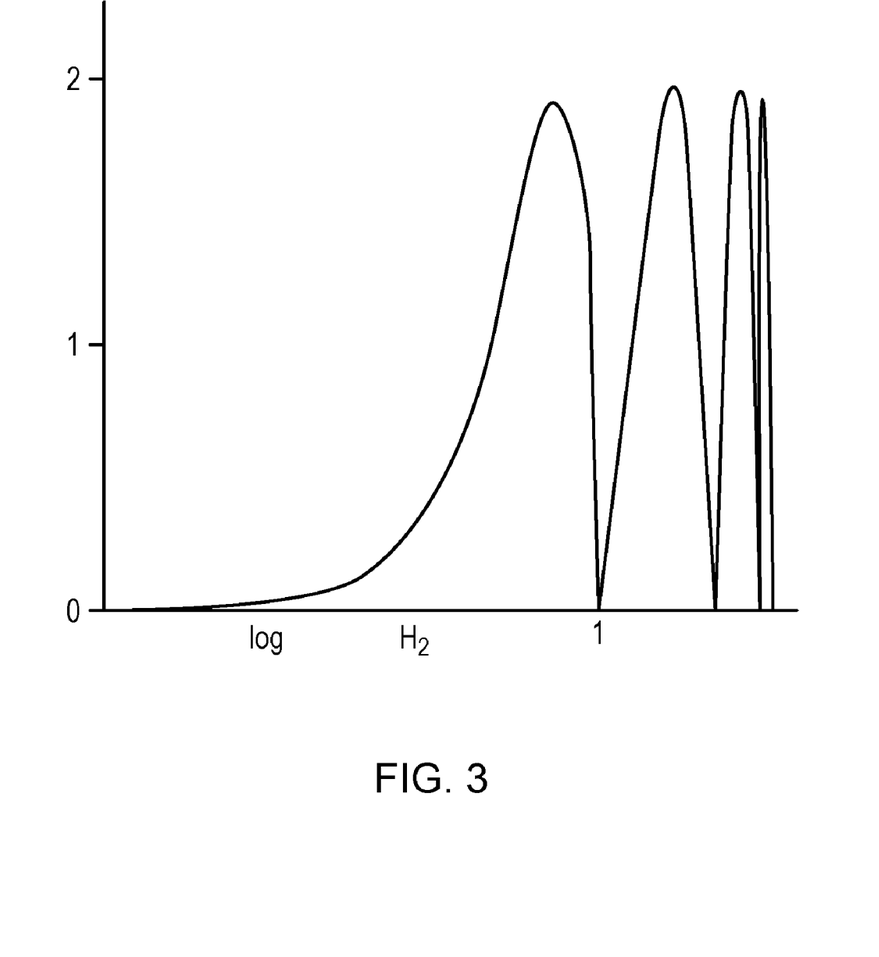
FIG. 3 is a logarithmic plot of amplitude versus frequency showing four individual frequency components the result of forming the difference between the signal at $T_2$ and the auto-zero component at $T_1$.

The result of forming the difference between sample values at $T_2$ and at $T_1$ is schematically shown in normalised form in FIG. 3, where a frequency corresponding to the period between $T_2$ and $T_1$ is represented "1" in the frequency axis which in this graph has a logarithmic frequency scale. A similar graph is presented as FIG. 4, where the time period between $T_2$ and $T_1$ is 30 ns.

Figure 4:
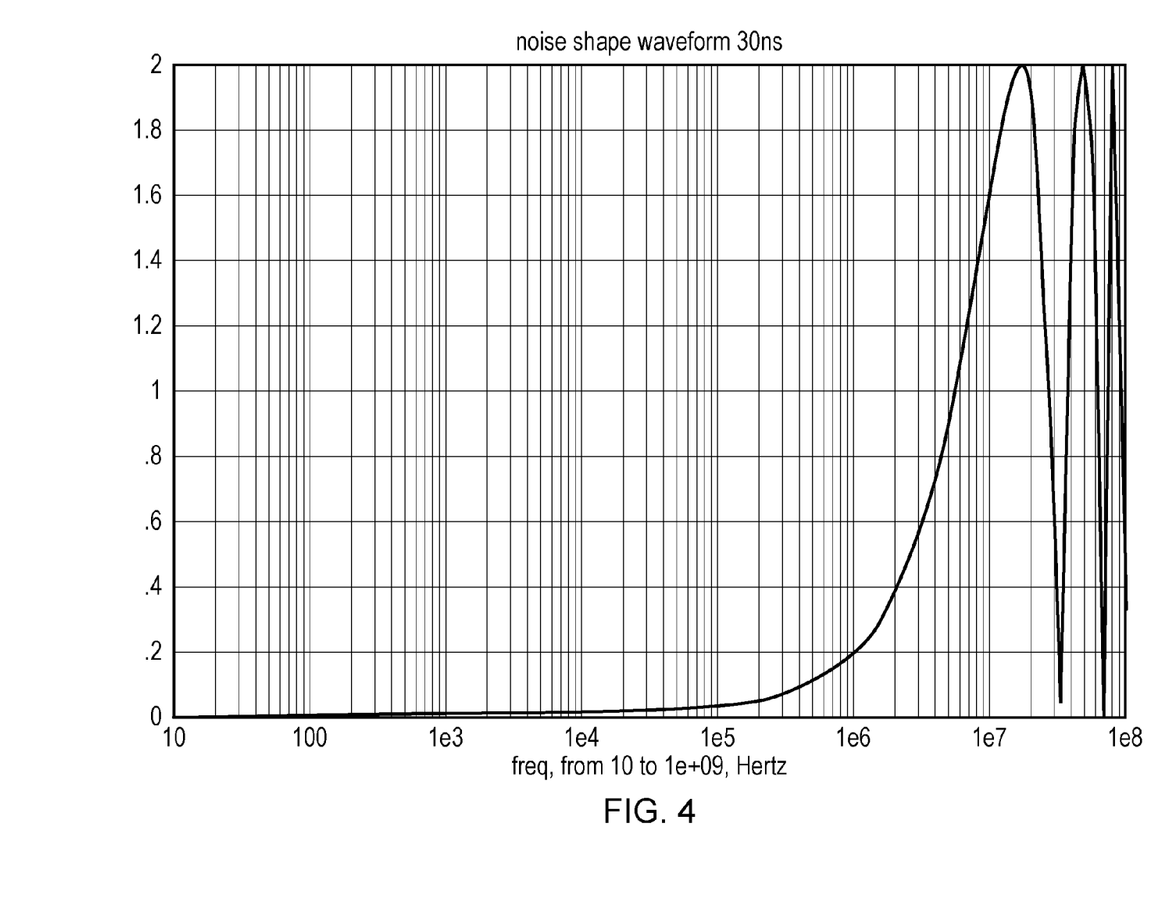
FIG. 4 is a plot of offset noise power versus frequency, where the time between $T_2$ and $T_1$ is 30 nanoseconds.

From this graph it can be seen that the offset cancellation process is effective in removing over 80% of the offset signal for frequencies up to 1 MHz and becomes worthwhile, but less effective as the frequency rises to 5 MHz. However for noise components from 5 MHz to around 20 MHz the contribution of these components is actually increased.

The time period $T_0$ between $T_1$ and $T_2$ is more or less fixed for most analog to digital converter applications, and in any event with most users wanting high speed performance it is advantageous to minimise or reduce $T_0$ as much as possible for low conversion times.

The residue amplified by the residue amplifier is a DC signal, however a lot of the "amplified" offset signal power occurs in high frequencies. Thus they only contribute noise. It therefore becomes possible to low pass filter these frequencies so as to reduce their contribution.

Such a low pass filter can be formed within the residue amplifier.

Figure 5:
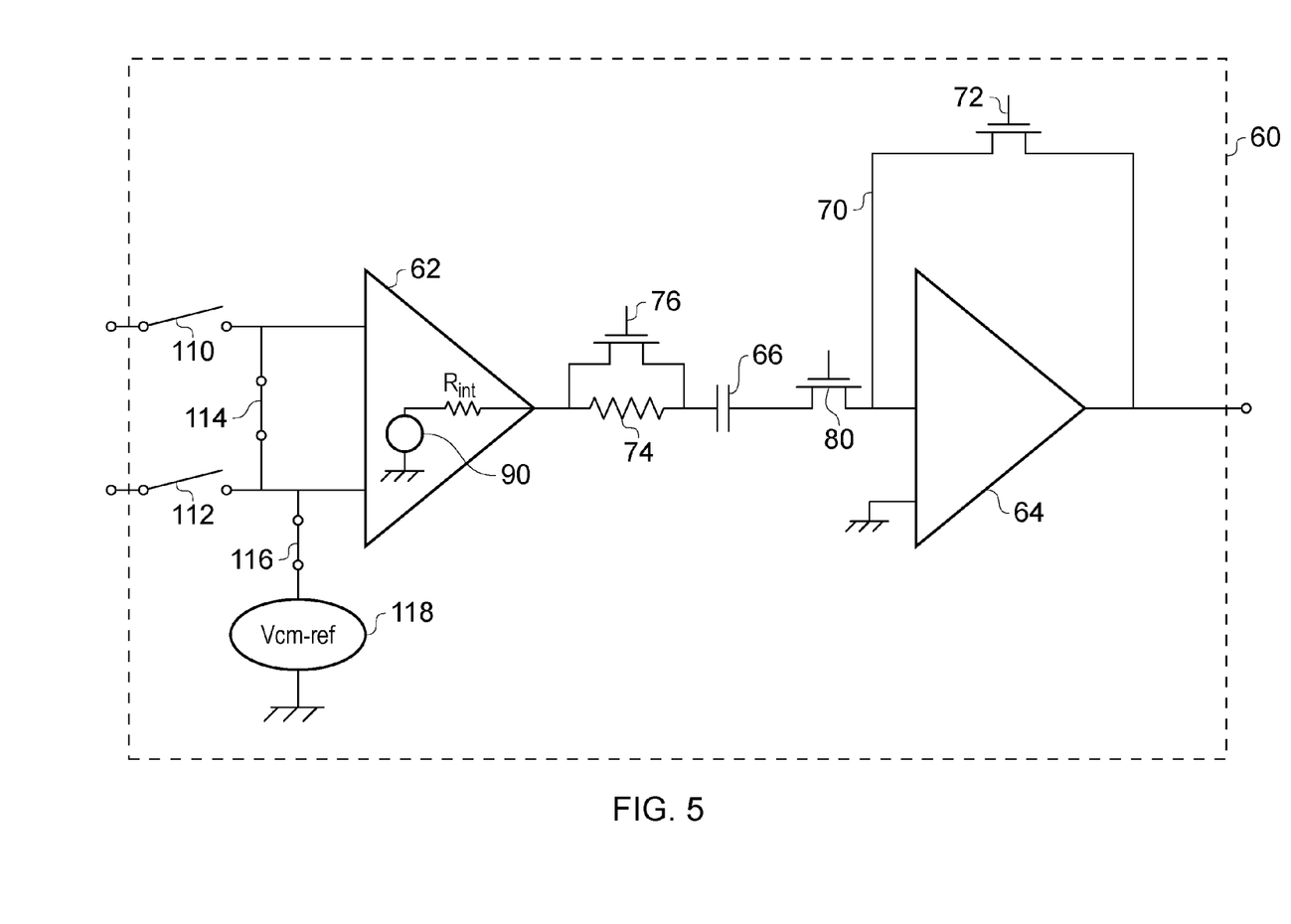
FIG. 5 schematically shows a single ended residue amplifier constituting an embodiment of the present invention.

FIG. 5 schematically shows an internal configuration of a residue amplifier constituting an embodiment of the present invention.

The residue amplifier shown in FIG. 5, and generally designated 60 comprises a first amplifier stage 62 and a second amplifier stage 64. The first amplifier stage 62 is a voltage amplifier typically having a gain between 10 and 20. The first amplifier stage 62 has its output connected to an input of the second amplifier stage 64 via a capacitor 66 which also functions as an offset sampling and auto-zeroing capacitor. The amplifier 64 is a transconductance amplifier which, during the offset acquire and auto-zeroing phase has its output connected to its input via a local feedback loop 70 controlled by transistor 72.

A resistor 74 in combination with a shorting switch 76 for shorting the resistor out is provided in series with the capacitor 66. The resistor is shown as being between the capacitor 66 and the output of the first stage amplifier 62, but the position of these components could be reversed. A further switch 80 is also provided in series with the capacitor 66 and is shown as being interposed between the capacitor 66 and an input to the second stage amplifier 64. Again this component could be moved with respect to the capacitor 66.

Initially assume that switch 80 is closed (in a low impedance state) and that shorting switch 76 is also closed (in a low impedance state) such that the output of the amplifier 62 is, in effect, directly connected to one plate (the left hand side plate as shown in FIG. 5) of the capacitor 66 and the other plate of the capacitor 66 is connected to the input of the second stage amplifier 64. Also during this auto-zero mode, the switch 72 is closed such that the feedback loop 70 around the amplifier 64 is operating, and switches 114 and 116 are closed while switches 110 and 112 are open. In this arrangement the capacitor forms part of a filter. The filter is effectively an RC filter although the resistive R components have not been explicitly shown. One resistance source is the transconductance amplifier 64 itself as, looking from the capacitor towards the transconductance amplifier 64 the effective impedance that the capacitor sees is $1/g_m$ typically this translates to about 200 ohms Similarly the first stage amplifier 62 has a non-zero output impedance, and can be regarded as an ideal voltage source 90 with a series resistor $R_{int}$. The value of $R_{int}$ is typically around 1 kΩ. Consequently, if the capacitor 66 has a value of about 4 pF then the capacitor 66 co-operates with the resistances inherent in the amplifiers to form a low pass filter having a break point at about 33 MHz. This gives rise to a filter time constant of about 5 ns. In one sense having a short time constant is good because once the auto-zero phase is completed, and a non-zero residue voltage is applied to the input of the amplifier, then the amplifier will have to change its output in order to reach the desired output $A \cdot V_{in}$. Thus short time constants are good for achieving fast settling of the amplifier. However, it can be seen that a 33 MHz bandwidth filter allows the noise in the 5 to 25 MHz range to pass through the amplifier, and indeed this noise will have been amplified by the constructive operation of the auto-zeroing process and the amplifier action. However, this bandwidth may not be required, and reducing the bandwidth would reduce the noise power propagated to the second stage of the residue amplifier, and consequently to the second analog to digital converter.

In order to achieve this reduction in bandwidth limiting resistor 74 is selectively placed in the series signal path with a capacitor 66. Resistor 74 can be made to "appear" by switching transistor 76 into a high impedance state such that current flow now passes through resistor 74 rather than bypassing it by flowing through the transistor 76. However having the resistor continually in series with the capacitor 66 results in increased phase shift between the output of amplifier 62 and the input of amplifier 64. This increased phase shift can lead to a ringing response, which in turn can result in a long settling time for the amplifier. Thus, during the residue generation and amplification phase the resistor 74 is shorted out such that the amplifier quickly settles towards the amplified residue value. However such a high bandwidth is not required during auto-zeroing so the transistor is placed in a high impedance state to place the amplifier in its second (low) bandwidth state during at least a final stage of the auto-zeroing process if not all of the auto-zeroing process.

As is known to the person skilled in the art, the time constant for the amplifier at its second bandwidth is $\tau = C \cdot R$, where R is the resistance in series with the capacitor.

It can therefore be seen that the noise performance of the residue amplifier during its auto-zeroing process can be improved by allowing a series resistor to be switched into the circuit in series with the offset and auto-zeroing capacitor 66.

Returning to FIGS. 2a to 2c, it can intuitively be seen that the signal to noise ratio advantage is only achieved if the samples at $T_1$ and $T_2$ are correlated with one another. As a consequence allowing to long a time period $T_0$ diminishes the effective correlation between the noise as sampled at the auto-zeroing sampling instant $T_1$, and the noise occurring during the residue formation instant $T_2$. This de-correlation causes the auto-zero action to become less effective.

Returning to FIG. 5, once auto-zeroing has been complete and the amplifier is used to amplify the residue signal, then the feedback loop 70 around the second stage amplifier 64 is broken by opening transistor switch 72 (placing it in a high impedance state). The amplifier remains stable because a further feedback loop is formed around the amplifier as a whole. Thus, at this stage, the output of the amplifier will rise to attain the desired output voltage $V_{out}=A \cdot V_{res}$. Thus the voltage at the output of the second stage 64 may be several volts.

During auto-zeroing the first stage amplifier 62 is isolated from the first analog to digital converter by switches 110 and 112 and then a further switch 114 is closed to short the inverting and non-inverting inputs of the amplifier 62 together. A further switch 116 may also be closed to connect the inputs of the amplifier to a common node voltage reference 118. If the circuit is well designed, then the voltage at the output of the amplifier 62 should still be relatively small. However, at the conclusion of the residue generation there may be a large amplified voltage at the output of the residue amplifier. Once the feedback loop 70 is closed by making transistor 72 conductive the voltage at the output of the second stage amplifier 64 may have to change significantly and this can give rise to a transient voltage change which is forced on to capacitor 66, and then has to decay away again with a relatively long time constant determined by the series resistor $R_{int}$, resistor 74 and the transconductance of the amplifier 64. Thus closing the feedback loop can perturb the offset voltage stored on capacitor 66.

The inventors realised that this perturbation could be alleviated by providing a further switch 80 in series with capacitor 66 and placing this switch in a high impedance state just before the feedback loop 70 is closed. Opening the switch 80 causes very little change to occur at the input of the amplifier 64 because the voltage thereon is maintained by parasitic capacitance within the input stage of the amplifier. Closing the feedback loop using transistor 72 places the output voltage of the amplifier at its input, and then the amplifier quickly settles bringing its output down from several volts to nearer zero volts. Once sufficient time has been allowed to pass for the amplifier to settle sufficiently transistor 80 is returned to a conducting state such that the combined offset of the first and second stage amplifiers 62 and 64 is updated on the capacitor 66.

It can reasonably be expected that the offset voltage will only change slowly over time. Thus, it only needs to be acquired accurately at device power up and then further updates can be performed in a small period of time as many tiny partial updates will aggregate together to cause the voltage to be accurately maintained.

At device power up many parts of the analog to digital converter device will require initialisation. However the residue amplifier is fairly responsive, and hence it can easily be allowed to perform the auto-zero process for many, i.e. 20 or more, time constants of the filter formed by capacitor 66 and the combined resistance it sees made up of the internal resistance $R_{int}$ of the amplifier 62 and 1/gm of the transconductance amplifier 64. From then on auto-zeroing updates can be made periodically, for example during the period whilst the first analog to digital converter is forming its partial result but before the result needs to be passed to the residue amplifier for amplification. Although this update time is much shorter than the full settling period of 20 time constants or so that would normally be described to the residue amplifier, each voltage change is small and hence each correction causes the amplifier to asymptote towards the correct value.

It is thus possible to provide an improved residue amplifier for use in a pipeline digital to analog converter.

The amplifier shown in FIG. 5 is a single ended device, although in general dual ended amplifiers are preferred. Such an amplifier is shown in FIG. 6.

Figure 6:
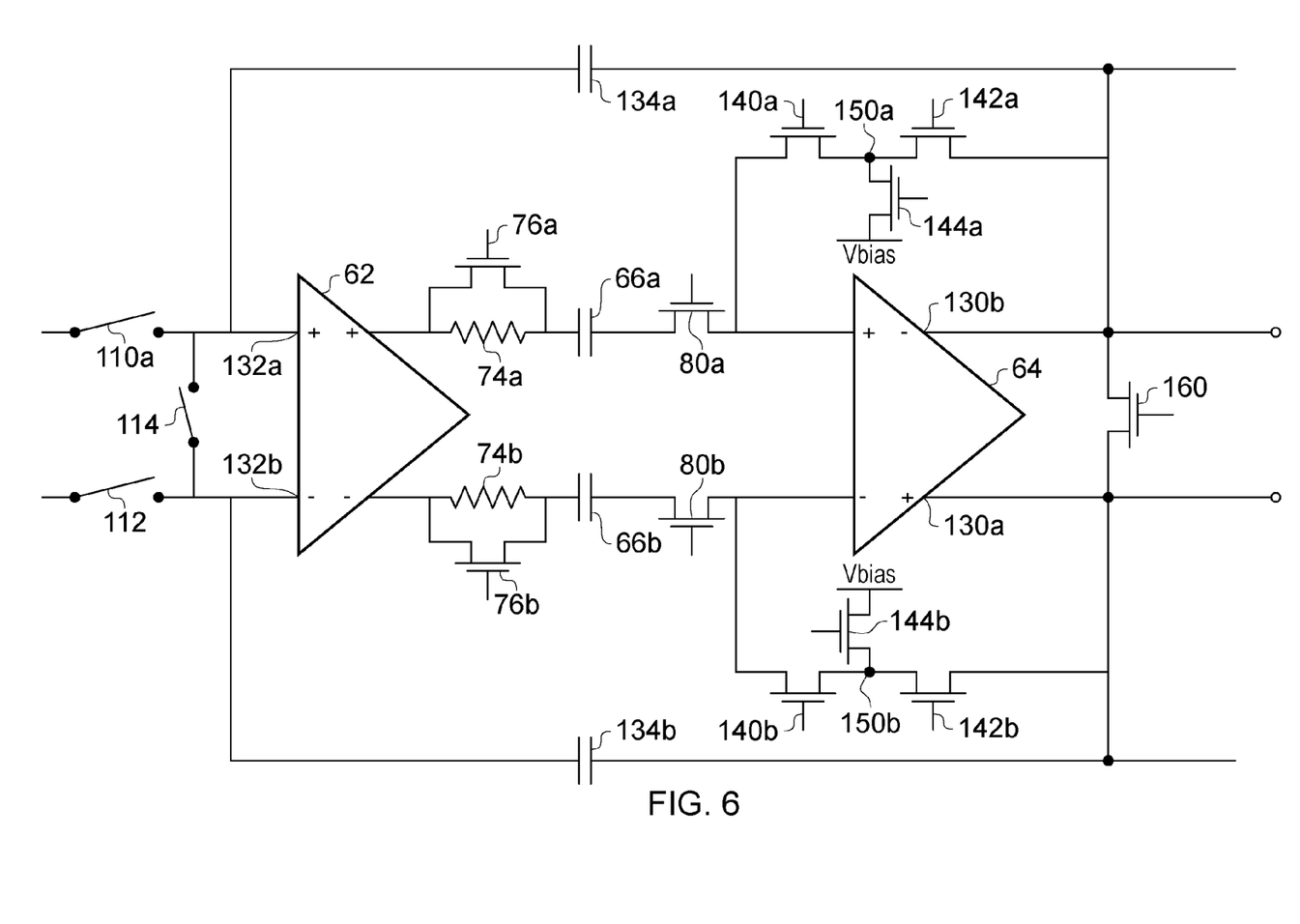
FIG. 6 is a circuit diagram for a dual ended residue amplifier for use in a dual ended SAR pipeline converter.

The dual ended device shown in FIG. 6 is very similar to that shown in FIG. 4 and like reference numerals have been used for like parts, with the designations "a" and "b" for components which are dedicated to a particular channel. The polarity of the inputs and the outputs are marked for each of the amplifiers 62 and 64 and furthermore the external feedback loops are shown. An inverting output 130b of the second stage amplifier 64 is connected to an non-inverting input 132a of the first stage amplifier 62 via a feedback capacitor 134a. Similarly a non-inverting output 130a of the second stage amplifier 64 is connected to the inverting input 132b of the first stage amplifier 62 via a feedback capacitor 134b. Thus when considering the residue amplifier as a whole, gain stability is ensured when operating in its normal mode and when operating in the auto-zero mode.

It can also be seen that transistor 72 in the feedback loop of the second stage amplifier 64 has been replaced by a combination of three transistors, of which only transistors 140a, 142a and 144a will be described in detail, as similar comments will apply to transistors 140b, 142b and 144b.

Figure 11:
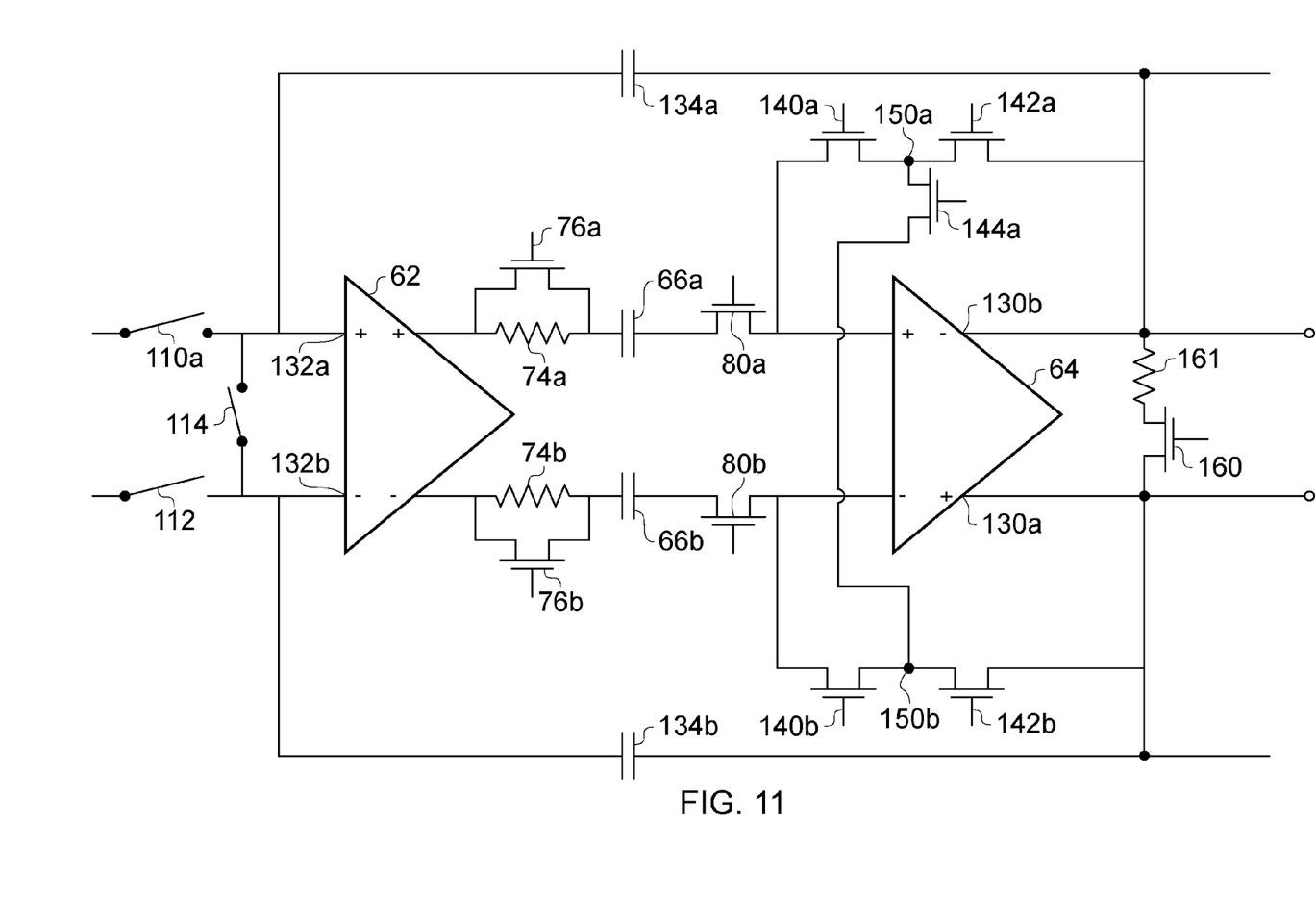
FIG. 11 shows a further embodiment of the present invention.

Transistors 140a and 142a are arranged in series between the inverting output 130b of the second stage amplifier 64 and its non-inverting input. Thus these transistors directly take the place of transistor 72 in FIG. 5. However the transistors define an intermediate node 150a between them and the further transistor 144a extends between the intermediate node and a bias voltage $V_{bias}$ which, conveniently, could be the ground voltage. In normal use, that is when the residue amplifier is acting in its amplifier mode, transistors 140a and 142a are in a high impedance state and transistor 144a is conducting. As a result node 150a is held at the bias voltage. This is advantageous because, in reality, each transistor has a parasitic capacitor interconnecting its source and drain terminals and hence even when the transistors are in the high impedance state there is a parasitic path in parallel with each of the transistors. In the arrangement shown in FIG. 5, although this parasitic path is small it is subjected to Miller effect gain and hence the size of the parasitic capacitor is effectively multiplied by the gain of the amplifier 64 and appears at the input of the amplifier 64. This then forms an attenuator when viewed in combination with capacitor 66a. In the arrangement shown in FIG. 6 although the parasitic capacitors still exist the parasitic connection between the output 130b and the amplifier input is broken by virtue of node 150a being held to the bias voltage. This reduces the amount of charge that needs to be added to or removed from the parasitic capacitances at the input stage of the amplifier 64 when switching between the normal amplifier mode and the auto-zeroing mode, and it also reduces the charge perturbation that could be introduced to the capacitors 66a and 66b when switching between modes, even allowing for the presence of transistors 80a and 80b. In an alternative arrangement just a single transistor, e.g. transistor 144a could extend between nodes 150a and 150b, as this has the same effect as holding the nodes at a bias voltage, such an arrangement is shown in FIG. 11.

In use, control signals to the switches are provided by a successive approximation routine controller 190 (FIG. 7) which controls the operation of the pipeline converter. Thus, the controller can arrange for switches 140a and 142a to be in a high impedance state until such time as auto-zeroing is commenced. Similarly it can arrange for switch 80a to be placed in a high impedance state just before switches 140a and 142a are closed, and can subsequently arrange for switch 80a to be placed in a low impedance state once a settling time for the amplifier 64 has elapsed. Similarly the controller can control the timing of the transistors 76a and 144a. The controller also controls the corresponding switches in the second channel.

Comparing FIG. 5 and FIG. 6, a further shorting transistor 160 has also been provided to short the outputs of the second stage amplifier 64 together during the above auto zero operation, prior to turning on switch 80, to speed up the setting of the amplifier 64 in this time. Alternatively a resistor could be placed in series with the transistor 160, and this then enables these components to modify the effective transconductance of the amplifier 64, which in turn allows the bandwidth of the RC filter to be varied.

Figure 7:
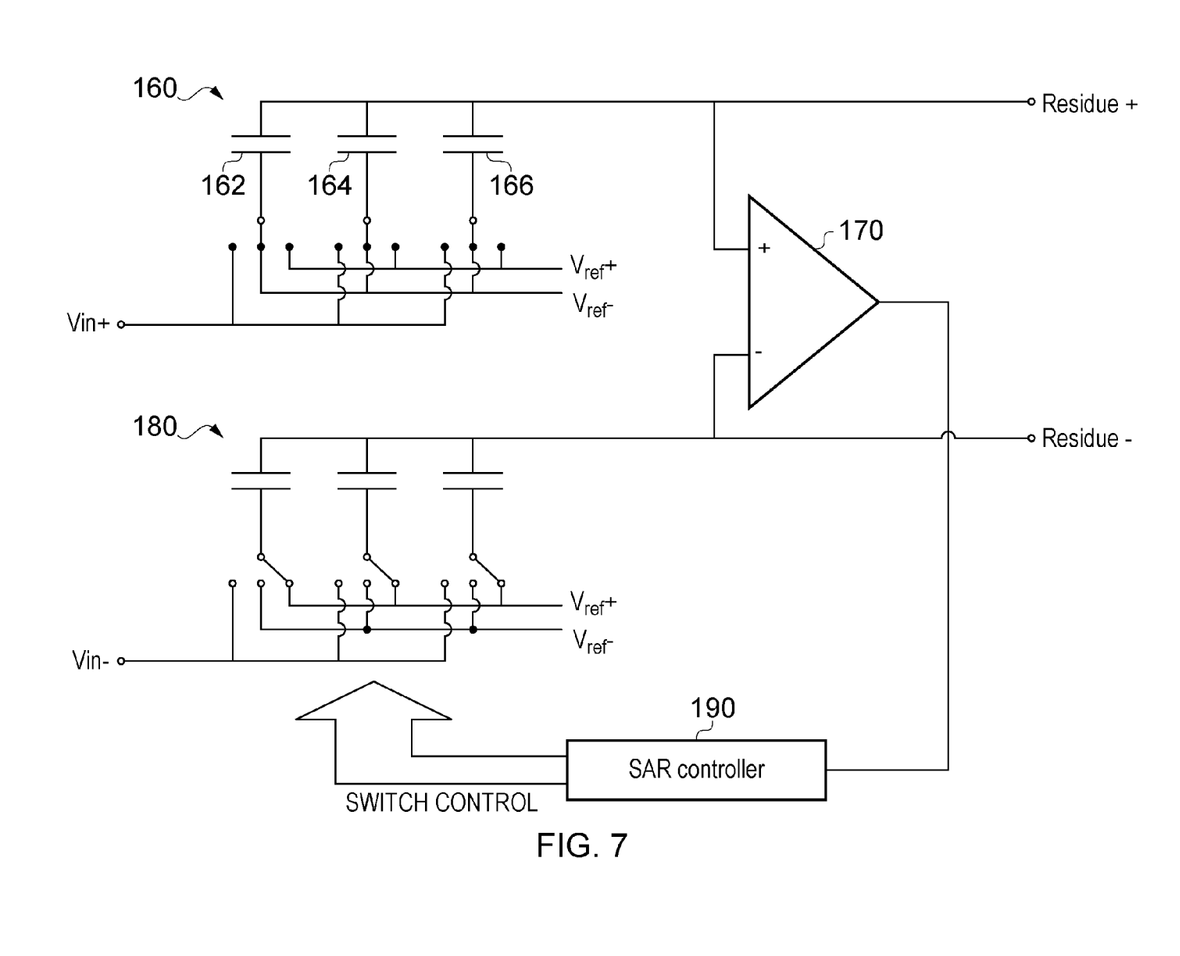
FIG. 7 schematically illustrates a dual ended conversion stage for a pipeline SAR converter.

FIG. 7 schematically shows a dual ended switched capacitor successive approximation routine conversion stage. The stage comprises a first switched capacitor array generally designated 160 for sampling the positive input of a differential signal and a second switched capacitor array, generally designated 180 for sampling and converting the negative input. The arrays are generally identical so only the array 160 will be described in detail. The capacitor array 160 in this example comprises capacitors 162, 164 and 166 each of which have their uppermost plates connected to a common line which connects to a terminal marked "residue+", and also to a first input of a comparator 170. Each of the capacitors has an associated three position switch which can connect its bottom plate to a positive reference $V_{ref+}$, a negative reference $V_{ref-}$ and a positive input signal $V_{in+}$. During a sampling phase each of the capacitors 162, 164 and 166 has its bottom plate connected to $V_{in+}$ whilst the terminal "residue+" is connected to a reference voltage causes the voltage $V_{in}$ to be sampled onto the capacitors. Following a sampling phase the connection of the "residue+" terminal to the reference voltage is removed and the switches associated with each capacitor connect the respective bottom plate to $V_{ref-}$.

A similar process occurs for the second capacitor array 180, except that after sampling the switches connect the bottom plates of the capacitors to $V_{ref+}$.

As is known to the person skilled in the art the SAR controller will then perform a plurality of bit trials, and for the first bit trial the switch associated with the first capacitor 162 is set to $V_{ref+}$ whilst the remaining switches are set to $V_{ref-}$. Thus the trial word sent to the array 160 can be regarded as "1 0 0". For the negative array 180, the first capacitor is set to $V_{ref-}$ whilst the other capacitors remain connected to $V_{ref+}$. Thus the trial word can be regarded as the inverse of the word presented to the array 160, i.e. "0 1 1". The relative voltages on the arrays 160 and 180 are then compared by comparator 170 and the result is used by the SAR controller 190 to determine whether the result of that bit trial should be kept or discarded. If the result is to be discarded then the switch associated with the capacitor 162 in the array 160 is reset such that the bottom plate of that capacitor is connected to $V_{ref-}$. A corresponding change is made in the array 180 such that the bottom plate of the most significant capacitor would be reset to $V_{ref+}$. If the result is kept, then no change is made to these switches. The converter then proceeds to the next bit trial and the process is repeated. The SAR conversion process described here is known to the person skilled in the art but has been included in the interests of clarity and completeness.

Figure 8:
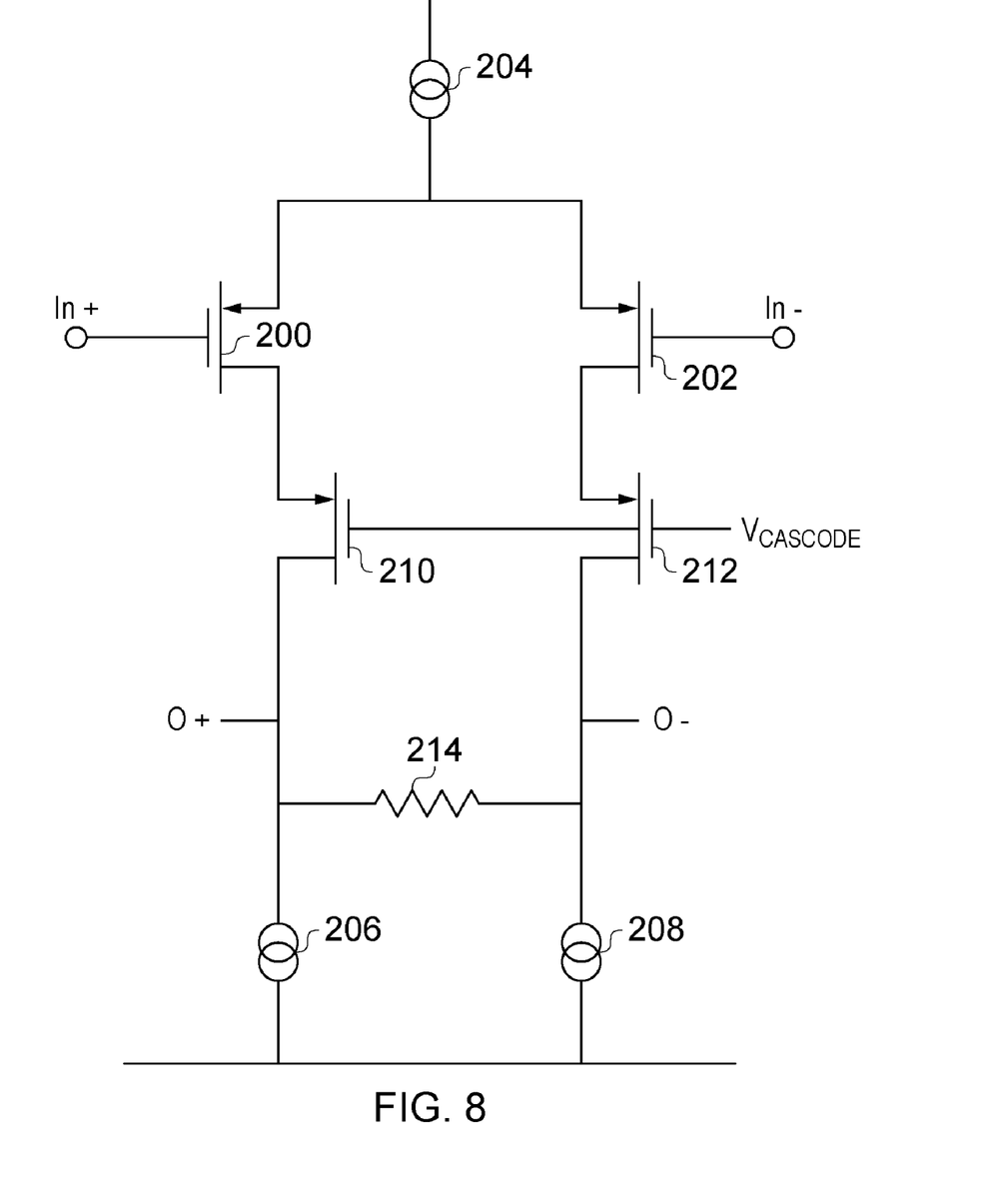
FIG. 8 shows, in simplified form, a circuit diagram for a first stage of the residue amplifier.

For completeness, FIG. 8 shows a simplified schematic of the first stage amplifier 62. It comprises a pair of transistors 200 and 202 arranged in a long tail pair and receiving current from a current source 204. The drains of the transistors 200 and 202 are connected to current sinks 206 and 208 via cascode transistors 210 and 212 whose function is well known to the person skilled in the art. The connections to the current sinks 206 and 208 also form output nodes O+ and O− which are interconnected via an impedance, in this case a resistor 214.

Figure 9:
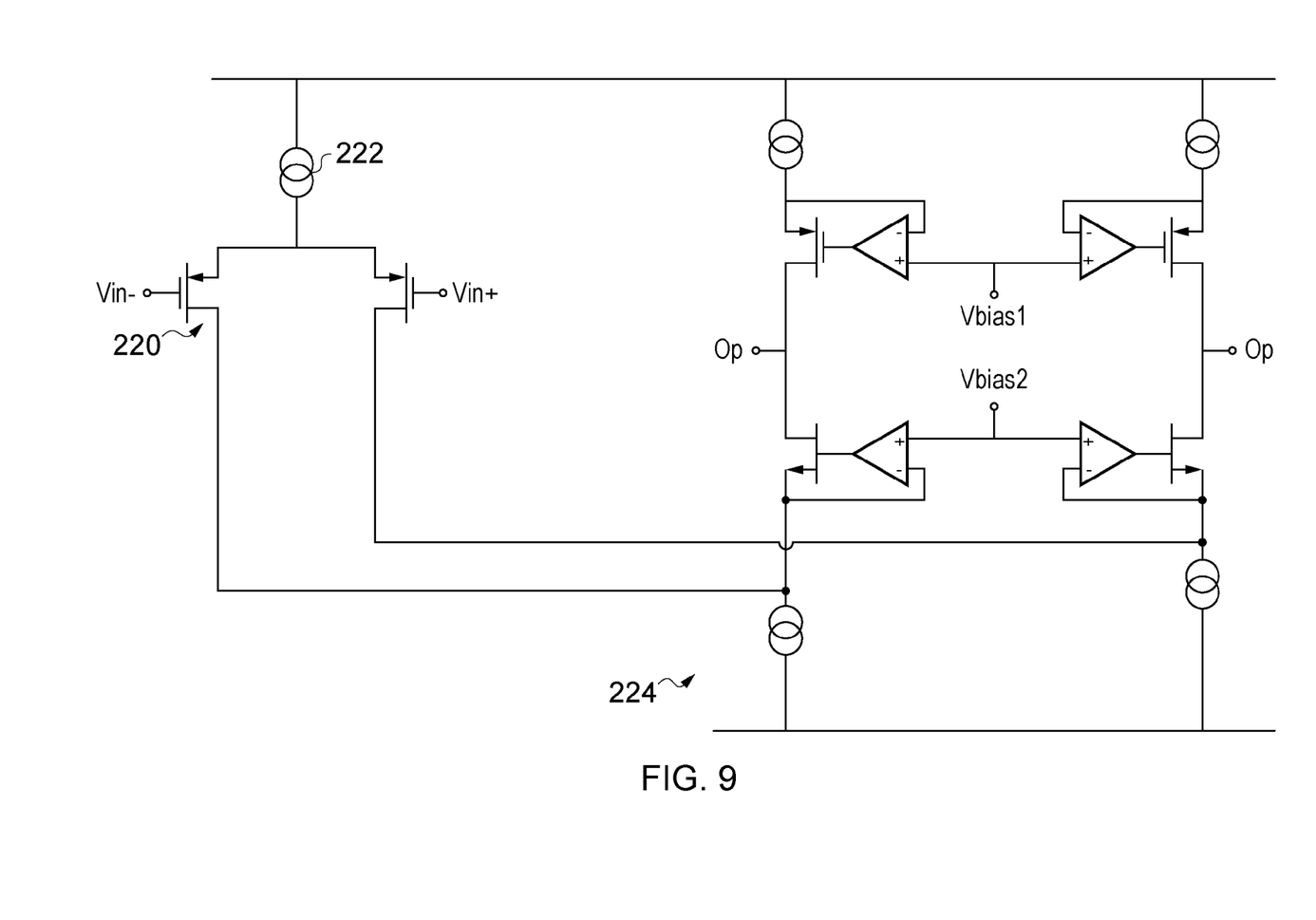
FIG. 9 shows, in simplified form, a circuit diagram for a second stage of the residue amplifier.

FIG. 9 schematically illustrates the second stage amplifier 64. As can be seen, it also comprises a long tail pair 220 receiving current from a current source 222, but now includes a gain boosted folded cascode stage 224, known to the person skilled in the art.

Figure 10:
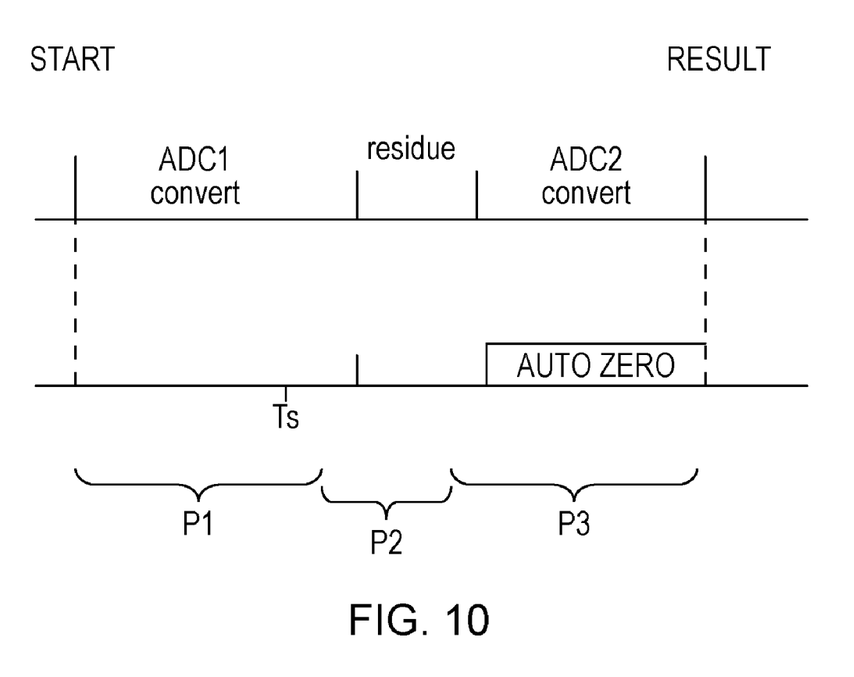
FIG. 10 is a timing diagram for one conversion as it passes along the pipeline of an ADC constituting an embodiment of the present invention.

FIG. 10 illustrates a timing diagram for a pipeline converter operating in accordance with the present invention during a single conversion. During a first period, labelled $P_1$, the first analog to digital converter 12 is performing its conversion. During this phase the residue amplifier can be in its auto-zero mode. In a first mode of operation the amplifier is kept in its low bandwidth mode, i.e. with resistor 74 in the current flow path, during all of the auto-zero period. However it is also possible to operate the residue amplifier in a manner such that it is generally in its high bandwidth mode, but, at a time designated $T_S$ prior to the end of the period $P_1$ the residue amplifier 30 is switched from its first, relatively high bandwidth mode to its second relatively low bandwidth mode. The period $T_S$ precedes the end of the period $P_1$, say, by one or more time constants of the amplifier in its low bandwidth mode. Thus the auto-zero amplifier samples its offset, but also the frequency components thereof while sampled remain reasonably correlated with noise on the amplifier at the beginning of the residue formation period. At the end of period $P_1$ the first analog to digital converter outputs its result and the residue amplifier 30 is controlled by the controller to amplify the residue. The output from the amplifier becomes settled at the end of the period $P_2$. At the end of $P_2$ the residue is sampled onto the second analog to digital converter which then starts its conversion during the period $P_3$. During this phase the residue amplifier may be returned to its auto-zero mode.

As noted before, one of the factors that contributes to the performance of the filter is the input impedance of the second stage of the amplifier. This can be altered in many ways. Thus a resistor could be selectively switched in and out of connection between the non-inverting and inverting outputs of the amplifier, or alternatively some current from the outputs can be directed away from the feedback loop, either via resistors or via current sources or current sinks. Thus this approach can be used in place of, or in conjunction with, the shorting transistor 76. Thus, the inclusion of a resistor 161 in series with the transistor 160 allows the effective transconductance of the amplifier to be varied by switching transistor 160 between conducting and non-conducting states.

It is thus possible to provide an improved pipeline SAR converter in which noise in the residue amplifier is reduced and the overall signal to noise performance of the converter is improved.

Converter technologies other than successive approximation routine converters are known and can be used in pipelines. The residue amplifier described herein can be used in conjunction with any pipeline converter technology where it is desired to amplify an analog residue from one stage and pass it to a subsequent stage within the converter.

The invention claimed is:
1. A pipeline analog to digital converter comprising:
a first analog to digital converter for determining a first part of an analog to digital conversion result, and for forming a residue signal;
an amplifier for amplifying the residue signal, the amplifier including at least one offset sampling capacitor for sampling an offset of the amplifier, wherein at least one resistance is associated with the at least one capacitor so as to form a filter, and the at least one resistance is variable such that the filter can be switched between a first bandwidth and a second bandwidth less than the first bandwidth.

2. A pipeline analog to digital converter as claimed in claim 1, in which the amplifier has first and second amplifier stages, and the at least one offset sampling capacitor interconnects the first stage to the second stage.

3. A pipeline analog to digital converter as claimed in claim 2, in which the at least one resistance comprises a resistor in series with the associated offset sampling capacitor.

4. A pipeline analog to digital converter as claimed in claim 3, in which an electrically controllable current flow path is provided in parallel with the resistor so as to varying the effective impedance presented by the resistor.

5. A pipeline analog to digital converter as claimed in claim 4, in which a transistor is provided to selectively shunt the resistor.

6. A pipeline analog to digital converter as claimed in claim 2, in which the second stage has a second stage feedback loop that is closed during an offset auto-zeroing process in which the offset is sampled, the amplifier further including an isolating switch for isolating the at least one offset sampling capacitor from the second stage.

7. A pipeline analog to digital converter as claimed in claim 6, in which the isolating switch is placed in a high impedance state for a time period that begins before the second stage feedback loop is closed, and ends after sufficient time has passed for the second stage to have substantially settled.

8. A pipeline analog to digital converter as claimed in claim 6, further including first, second and third switches in the second stage feedback loop, and wherein the first and second switches are in series connection between an output of the second stage amplifier and an input thereof, and the third switch is operable to connect an intermediate node between the first and second switches to a reference voltage.

9. A pipeline analog to digital converter as claimed in claim 8, in which the first, second and third switches are transistors are under the control of a controller such that when the first and second transistors are in a low impedance state, the third transistor is in a relatively high impedance state, and when the first and second transistors are in a high impedance state the third transistor is in a low impedance state.

10. A pipeline analog to digital converter as claimed in claim 3, in which the pipeline analog to digital converter is a dual ended device, and the residue amplifier is a dual ended amplifier.

11. A pipeline analog to digital converter as claimed in claim 10, in which the amplifier comprises two channels, and each channel has a respective offset sampling capacitor, and a variable resistance cooperating with the capacitor to form a filter.

12. A pipeline analog to digital converter as claimed in claim 10, in which a second stage amplifier has second stage feedback loops connecting to a non-inverting output of the first stage amplifier to an inverting input of the second stage amplifier, and an inverting output of the first stage amplifier to a non-inverting input of the second stage amplifier, and each feedback loop comprises first and second series connected switches having an intermediate node therebetween, and a further switch is provided to selectively connect the intermediate nodes of the feedback loops together.

13. A pipeline analog to digital converter as claimed in claim 1, in which a controller controls the variable resistance such that during an auto-zero phase an offset of the amplifier is sampled onto the sampling capacitor, and a predetermined period prior to the end thereof the bandwidth of the amplifier is reduced and during a residue amplification phase the amplifier forms a signal representing the amplified residue minus a substantially reduced amplifier offset.

14. A pipeline analog to digital converter as claimed in claim 1, in which the at least one resistance comprises an impedance of a first stage of the residue amplifier.

15. A pipeline analog to digital converter as claimed in claim 1, in which the at least one resistance comprises an input impedance of a further stage of the residue amplifier and the sampling capacitor is connected to an input of the further stage.

16. A pipeline analog to digital converter as claimed in claim 15, in which the further stage of the residue amplifier is a voltage to current amplifier, and the input impedance thereof is variable by changing the effective transconductance of the stage.

17. A pipeline analog to digital converter as claimed in claim 16, in which the transconductance is varied by changing a current in an input stage, varying an impedance at an output of the further stage, or diverting current in the feedback loop around the further stage.

18. A pipeline analog to digital converter as claimed in claim 1, in which a controller controls the variable resistance such that during a residue amplification phase the amplifier is operated at the first bandwidth.

19. A pipeline analog to digital converter as claimed in claim 17, in which during an auto zero operation the amplifier is operated substantially or exclusively at the second bandwidth.

20. A method of operating a pipeline analog to digital converter comprising a first analog to digital conversion stage, a second analog to digital conversion stage, a residue amplifier for amplifying a residue from the first analog to digital conversion stage for use as an input to the second analog to digital conversion stage, and wherein the residue amplifier is further under the control of the controller to perform auto-zeroing and is switchable between a first bandwidth and a second bandwidth having a second bandwidth time constant, and wherein, in use, the residue amplifier is placed in an auto-zero mode for at least some of the time when it is not required to amplify the residue, and a predetermined period before amplification of the residue is required the bandwidth of the residue amplifier is reduced during its auto-zeroing operation, or the amplifier is operated at the reduced bandwidth during the entirety of the auto-zeroing operation and then subsequently is operated at the first bandwidth during the residue amplification phase.

21. A pipeline analog to digital converter, comprising:
a first analog to digital converter for determining a first part of an analog to digital conversion result and for forming a residue signal; and
an amplifier for amplifying the residue, the amplifier comprising a first stage, a second stage and an offset sampling capacitor interconnecting an output of the first stage to an input of the second stage, and wherein an impedance comprising at least one of a resistor and a capacitor is associated with the offset sampling capacitor and is switchable or variable so as to co-operate with the offset sampling capacitor to enable a bandwidth of the amplifier to be switched between first and second bandwidths.

* * * * *